(12) United States Patent
Mitarai et al.

(10) Patent No.: US 6,246,082 B1
(45) Date of Patent: Jun. 12, 2001

(54) SEMICONDUCTOR MEMORY DEVICE WITH LESS CHARACTERISTIC DETERIORATION OF DIELECTRIC THIN FILM

(75) Inventors: Shun Mitarai, Tenri; Shigeo Ohnishi, Nara; Tohru Hara, Tokyo-to, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/176,508

(22) Filed: Oct. 21, 1998

(30) Foreign Application Priority Data

Oct. 24, 1997 (JP) .................................................. 9-292354

(51) Int. Cl.[7] .................................................. H01L 29/76
(52) U.S. Cl. ......................... 257/295; 257/310; 257/757; 257/761
(58) Field of Search ................................... 257/295, 306, 257/310, 646, 757, 761, 764

(56) References Cited

U.S. PATENT DOCUMENTS

| 5,481,490 | 1/1996 | Watanabe et al. . |
| 5,585,300 | 12/1996 | Summerfelt . |
| 5,962,904 | * 10/1999 | Hu ........................................ 257/412 |
| 6,025,269 | * 1/2000 | Sandhu ................................ 438/688 |

FOREIGN PATENT DOCUMENTS

| 0 697 720 A1 | 2/1996 | (EP) . |
| 0 722 190 A2 | 7/1996 | (EP) . |
| 0 766 319 A2 | 2/1997 | (EP) . |
| 7-111318 | 4/1995 | (JP) . |
| 7-273297 | 10/1995 | (JP) . |
| 08097382 | 12/1996 | (JP) . |

OTHER PUBLICATIONS

"Barrier Metal Properties of Remote–Plasma MOCVD TaN and Amorphous Ta–Si–N Layers for Stacked Ferroelectric Capacitor Cell" by Han C. H et al. ICVC '97. 5TH International Conference on VLSI and CAD, Seoul, South Korea, Oct. 13–15, 1997, pp. 610–612, XP002121194 1997, Kyungki–do, South Korea, SamSung Electron, South Korean ISBN: 89:950044–0–1.

"Barrier Properties for Oxygen Diffusion in a Tasin Layer" by Hara T. et al. Japanese Journal of Applied Physics, vol. 36, No. 7B, Jul. 15, 1997, pp. L893–L895, XP000737962 ISSN: 0021–4922.

\* cited by examiner

*Primary Examiner*—Sara Crane
(74) *Attorney, Agent, or Firm*—Morrison & Foerster LLP

(57) ABSTRACT

There is provided a semiconductor memory device with extremely less deterioration of characteristics of dielectric thin film and with high stability. A TaSiN barrier metal layer 13 is formed on a Pt upper electrode 12. This TaSiN barrier metal layer 13 has electrical conductivity and hydrogen-gas blocking property and besides has an amorphous structure stable in high temperature region without crystallizing even during firing for crystallization of an oxide ferroelectric thin film (SBT thin film) 11. Then, hydrogen gas generated during later formation of a second interlayer insulating film 15 is reliably blocked from invading into the oxide ferroelectric thin film 11, by which characteristic deterioration of the oxide ferroelectric thin film 11 due to hydrogen gas is prevented.

8 Claims, 7 Drawing Sheets

Fig. 6 PRIOT ART
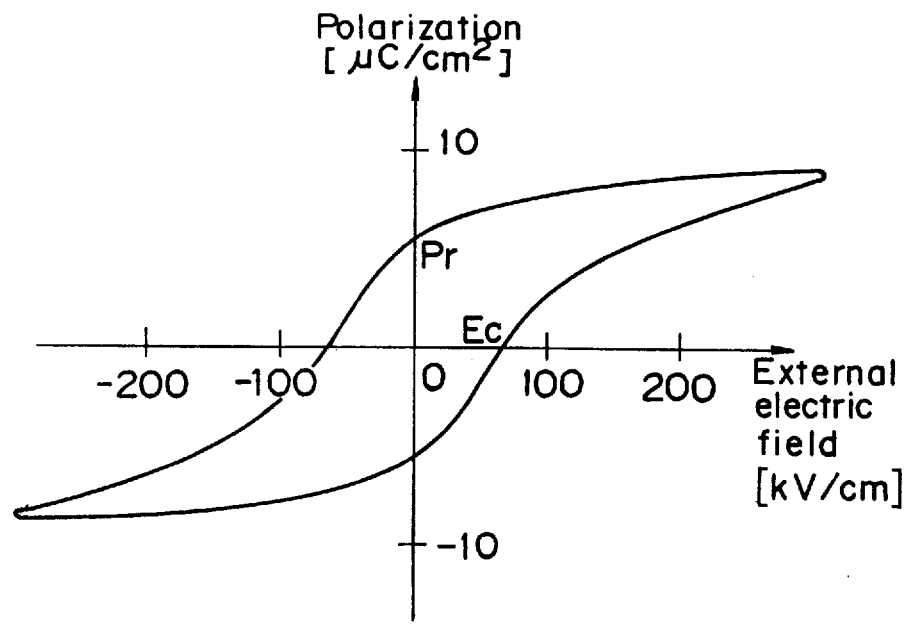
Fig. 7
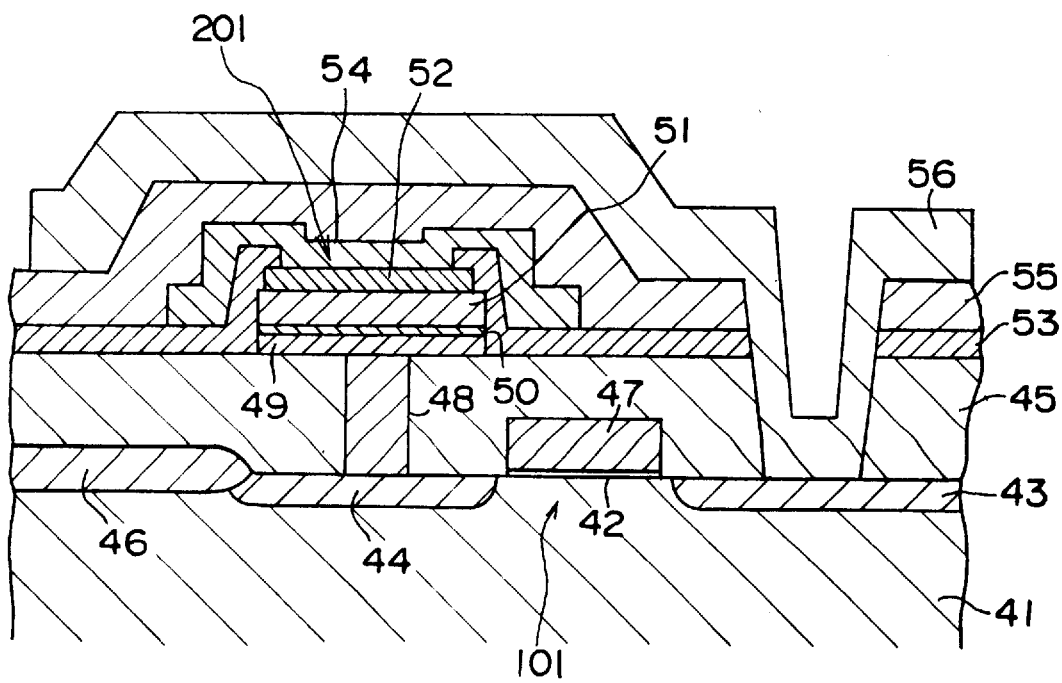

SEMICONDUCTOR MEMORY DEVICE WITH LESS CHARACTERISTIC DETERIORATION OF DIELECTRIC THIN FILM

FIELD OF THE INVENTION

The present invention relates to a semiconductor memory device utilizing high dielectric thin film or ferroelectric thin film.

BACKGROUND OF THE INVENTION

In recent years, as semiconductor memory devices such as DRAM (Dynamic Random Access Memory) have been increasing in storage capacity with their higher densities and higher integrations, there have been studied semiconductor memories utilizing high dielectric thin film materials having higher dielectric constants as compared with silicon oxide. Among the high dielectric materials are STO ($SrTiO_3$; strontium titanate), BST (($Ba,Sr)TiO_3$; barium-strontium titanate), tantalum oxide ($Ta_2O_5$) and the like, which are under discussion for applications to high-integration DRAMs or the like.

On the other hand, ferroelectric materials having many functions such as pyroelectricity, piezoelectricity and electro-optical effect are applied to a wide variety of device development including infrared sensors, piezoelectric filters, optical modulators and the like. Among others, nonvolatile memory devices (ferroelectric memory devices) utilizing the unique electrical characteristic of spontaneous polarization have been widely studied in view of their potentiality of replacing most memories from conventional nonvolatile memories to SRAMs (static RAMs) and DRAMs by virtue of their fast write/read operations, low voltage operations and other characteristics.

The mainstream of ferroelectric materials has been those belonging to perovskite type oxides typified by PZT (Pb(Zr, Ti)$O_3$; lead zirco-titanate). However, in recent years, bismuth layer-structured compound materials such as $SrBi_2Ta_2O_9$ have been gaining attention in terms of their resistance to repetition of polarization inversion and being investigated for practical application to ferroelectric memory devices.

Generally, in a semiconductor memory device which uses the aforementioned oxide thin-film materials as a capacitor insulating layer, after the formation of an upper electrode, it is covered with an interlayer insulating film of BPSG (boro-phospho silicate glass) or the like which purposes primarily electrical insulation between semiconductor memory devices. In this case, unfortunately, hydrogen gas produced as a reactive byproduct has a reduction effect on the oxide thin-film interface so that the adhesion property between the upper electrode and the oxide thin film is lowered, which leads to a problem that peeling occurs between the upper electrode and the oxide thin film. There is a further problem that, under the influence of the hydrogen gas, the dielectric constant of the capacitor lowers, or in the case of a ferroelectric thin film, deterioration of its characteristics occurs. This has been a great obstacle in practicalizing devices using semiconductor memory devices in which the above oxide thin-film materials are employed as a capacitor insulating film.

Also, in a semiconductor memory device which uses MOS (Metal Oxide Semiconductor) transistors as a switching device, lattice defects occurring within a silicon single crystal substrate during the manufacturing process would cause characteristic deterioration of the MOS transistors. This would require restoring the MOS characteristics by heat treatment in a hydrogen-mixed nitrogen gas (forming gas) in the final process. However, the concentration of hydrogen in that process is higher than that of hydrogen produced during the formation of the aforementioned interlayer insulating film, thus having a very large effect on the capacitor.

In order to solve these problems, the following proposals have been made. First, in a ferroelectric memory described in Japanese Patent Laid-Open Publication HEI 7-111318, upper part of a capacitor is coated with an Al, Si or Ti nitride thin film, which serves for a protective film. However, this protective film would crystallize at firing temperatures for crystallization of $SrBi_2Ta_2O_9$ when $SrBi_2Ta_2O_9$ is used as the ferroelectric substance. Then, the crystallized protective film disadvantageously has difficulty in obtaining enough hydrogen-gas blocking property because grain boundaries serve as paths. This would occur likewise also when a crystal protective film such as TiN film is used.

Also, in a ferroelectric memory described in Japanese Patent Laid-Open Publication HEI 7-273297, a metal oxide layer which reacts with moisture content adsorbed to the inside of a ferroelectric thin film is used as a first protective film, and a ferroelectric layer which reacts with hydrogen gas produced in the process of forming an interlayer insulating film is used as a second protective film. However, when an insulator like the metal oxide that is the first protective film is used as the protective film for upper part of the capacitor, it is necessary to provide an opening as a takeout hole for the upper electrode, so that enough effect as a protective film could not be expected. Otherwise, because of lack of electrical conductivity, some structural contrivance would be necessitated, which leads to a problem that contrivances for film deposition or processing become also complex.

Further, in the case of a memory device having a structure that several kinds of electrodes and metal wirings are present with the protective film interposed therebetween, as in the second protective film, when the protective film itself comes to have ferroelectricity, there may occur trouble in the operation of the memory device. Therefore, it is necessary to suppress the development of ferroelectricity, for example, by non-crystallizing or partly non-crystallizing the protective film, which leads to another problem that the manufacturing process becomes complex.

In any case, the above protective films still remain problematic as a material forming the upper electrode.

Furthermore, when an oxide high dielectric such as $Ta_2O_5$ is used as a capacitor insulating film for DRAMs or the like, TiN film is commonly used as the upper electrode. In this case, there is a problem that oxygen of the capacitor insulating film escapes to the upper electrode during the annealing after the formation of an interlayer insulating film, causing an increase of the leakage current.

SUMMARY OF THE INVENTION

An object of the present invention is therefore to provide a semiconductor memory device which is extremely small in deterioration of characteristics such as dielectric constant, residual dielectric polarization value, leakage current density, dielectric withstand voltage and the like of a dielectric thin film, and which is high in stability.

In order to achieve the above object, the present invention provides a semiconductor memory device comprising:

a capacitor including a lower electrode, an oxide high-dielectric thin film or oxide ferroelectric thin film, and an upper electrode; and a barrier layer which covers the upper electrode of the capacitor and which has electrical conductivity and hydrogen-gas blocking property.

With this constitution, after the formation of the barrier layer, the formation of the interlayer insulating film and the restoration of MOS characteristics are executed, where hydrogen gas produced or used in these processes would attempt to invade into the oxide high-dielectric thin film or oxide ferroelectric thin film side. However, this hydrogen gas is blocked by the barrier layer. Thus, the reduction effect of the hydrogen gas on the oxide dielectric thin-film interface is prevented, and the peeling between the upper electrode and the oxide dielectric thin film as well as the characteristic deterioration of the capacitor including the oxide dielectric thin film are avoided.

Further, because the barrier layer has electrical conductivity, there is no need of providing an electrode takeout hole. Accordingly, successful contact with the lead-out wiring can be achieved while the oxide dielectric thin film is protected enough.

In an embodiment, the barrier layer has such an amorphous structure that the barrier layer is not crystallized at firing temperatures for crystallizing the oxide high-dielectric thin film or oxide ferroelectric thin film.

With this constitution, the barrier layer maintains the amorphous state without being crystallized at firing temperatures for crystallization of the oxide high-dielectric thin film or the oxide ferroelectric thin film. Therefore, paths of grain boundaries are not formed so that the barrier layer fulfills the hydrogen-gas blocking effect.

An embodiment further comprises a MOS transistor connected to the capacitor.

With this constitution, hydrogen gas in the forming gas used for the characteristic restoration of the MOS transistors can be prevented by the barrier layer from invading the oxide high dielectric or the oxide ferroelectric.

In an embodiment, the barrier layer is a nitride thin film in a combination of silicon and any one of zirconium, niobium, molybdenum, hafnium, tantalum and tungsten, or a nitride thin film in a combination of silicon and any combination among zirconium, niobium, molybdenum, hafnium, tantalum and tungsten.

In an embodiment, the barrier layer is formed of a material which is expressed as $M_xSi_{1-x}N_y$ where M represents the zirconium, niobium, molybdenum, hafnium, tantalum or tungsten, Si represents the silicon and N represents nitrogen, and which satisfies that $0.75 \leq \leq 0.95$ and $0 < y \leq 1.3$.

With this constitution, a barrier layer having good electrical conductivity and hydrogen-gas blocking property and moreover having an amorphous structure stable in high temperature region can be obtained.

The present invention provides a semiconductor memory device which comprises a capacitor including a lower electrode, an oxide high-dielectric thin film or oxide ferroelectric thin film stacked on the lower electrode, and an upper electrode which is stacked on the oxide high-dielectric thin film or oxide ferroelectric thin film and which has electrical conductivity and oxygen-gas blocking effect.

With this constitution, after the formation of the oxide high-dielectric thin film or the oxide ferroelectric thin film, firing process is carried out for stabilizing this oxide high-dielectric thin film or the oxide ferroelectric thin film. In this process, escape of oxygen gas from the oxide high-dielectric thin film or the oxide ferroelectric thin film is prevented by the oxygen-gas blocking property of the upper electrode formed on the oxide high-dielectric thin film or the oxide ferroelectric thin film. Thus, any deterioration of the leakage current characteristic of the oxide high-dielectric thin film or the oxide ferroelectric thin film due to the escape of oxygen gas is avoided.

In an embodiment, the upper electrode has such an amorphous structure that the upper electrode is not crystallized at firing temperatures for crystallizing the oxide high-dielectric thin film or oxide ferroelectric thin film.

Because the upper electrode maintains the amorphous state without being crystallized at firing temperatures of the oxide high-dielectric thin film or the oxide ferroelectric thin film, paths of grain boundaries are not formed so that the escape of the oxygen gas can effectively prevented.

An embodiment futher comprises a MOS transistor connected to the capacitor.

With this constitution, during the restoration of characteristics of the MOS transistors, escape of oxygen gas from the oxide high-dielectric thin film or oxide ferroelectric thin film can be prevented by the upper electrode.

In an embodiment, the upper electrode is a nitride thin film in a combination of silicon and any one of zirconium, niobium, molybdenum, hafnium, tantalum and tungsten, or a nitride thin film in a combination of silicon and any combination among zirconium, niobium, molybdenum, hafnium, tantalum and tungsten.

In an embodiment, the upper electrode is formed of a material which is expressed as $M_xSi_{1-x}N_y$ where M represents the zirconium, niobium, molybdenum, hafnium, tantalum or tungsten, Si represents the silicon and N represents nitrogen, and which satisfies that $0.75 \leq \leq 0.95$ and $0 < y \leq 1.3$.

With this constitution, an upper electrode having good electrical conductivity and oxygen-gas blocking property and moreover having an amorphous structure stable in high temperature region is formed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a view showing an external electric field—polarization hysteresis loop in the prior art ferroelectric memory device shown in FIG. 4;

FIG. 7 is a sectional view of a high dielectric memory device as an example of the semiconductor memory device of the present invention;

DETAILED DESCRIPTION OF THE PREFERRED EMBODIMENTS

Hereinbelow, the present invention is described in detail by embodiments thereof illustrated in the accompanying drawings.

(First Embodiment)

In this embodiment, a barrier metal layer having electrical conductivity and hydrogen-gas blocking property and moreover having an amorphous structure stable in high temperature region is formed in upper part of a capacitor comprising a lower electrode, an oxide ferroelectric layer and an upper electrode.

Figure 1:
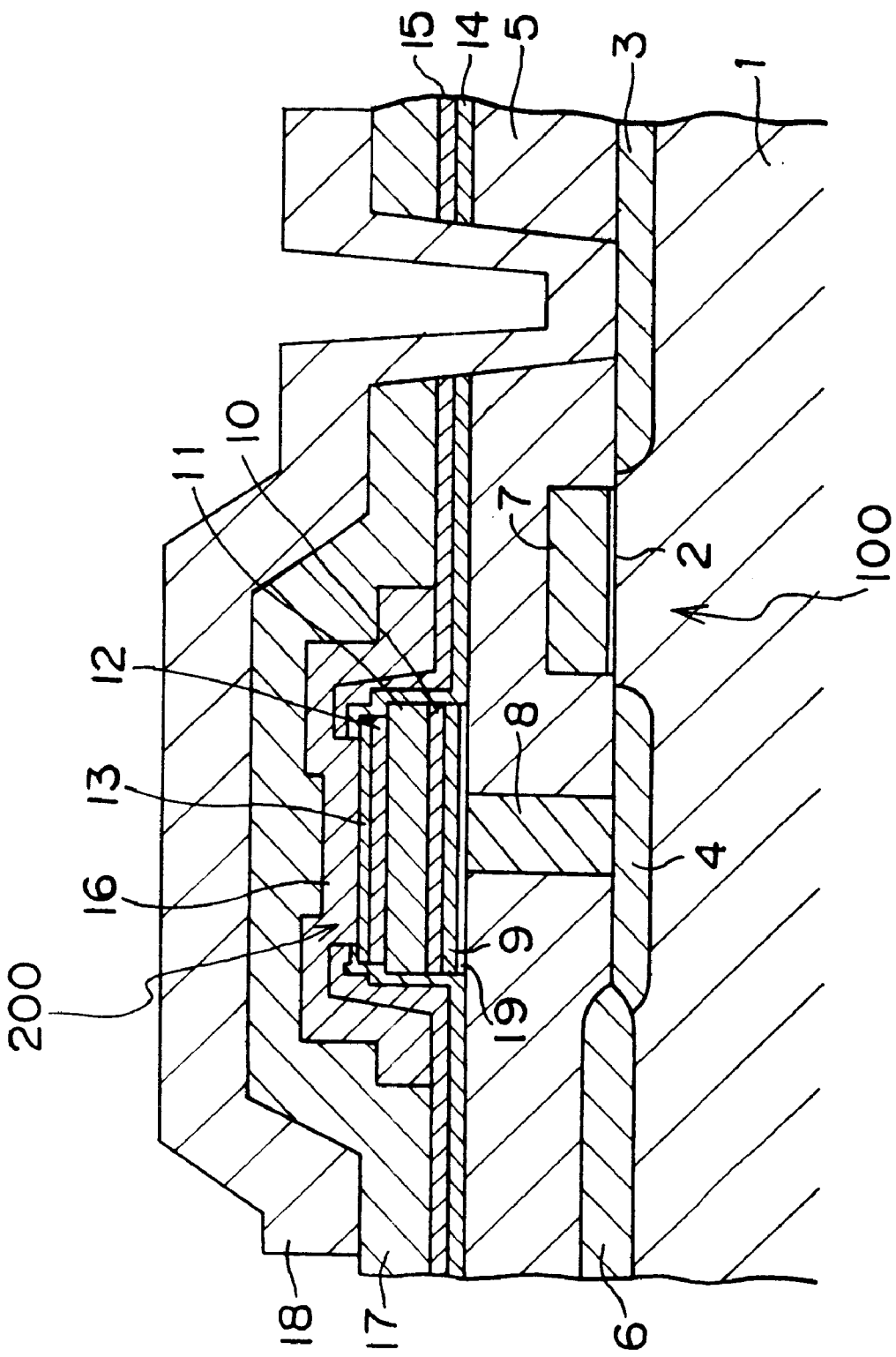
FIG. 1 is a sectional view of a ferroelectric memory device as an example of the semiconductor memory device according to the present invention.

FIG. 1 is a sectional view of a ferroelectric memory device of this embodiment. This ferroelectric memory device has the following constitution.

A MOS transistor 100 (which is one MOS transistor constituting a CMOS (Complementary MOS) transistor; the other MOS transistor is not shown) having a gate oxide film 2, a second conductive type impurity diffusion region 3 as a source region, and a second conductive type impurity diffusion region 4 as a drain region is formed on a first conductive type silicon substrate 1 and covered with a first interlayer insulating film 5. Reference numeral 6 denotes device isolation oxide film and 7 denotes a polysilicon word line. Then, in the first interlayer insulating film 5, a contact plug 8 is formed for connecting the CMOS transistor and capacitor part 200 to each other.

At a position on the first interlayer insulating film 5 where the contact plug 8 is provided, a Ti layer 19, a TiN barrier metal layer 9, a Pt lower electrode 10, an oxide ferroelectric thin film 11, a Pt upper electrode 12 and a TaSiN barrier metal layer 13 are provided in succession, forming the capacitor part 200. The capacitor part is further covered with a $Ta_2O_5$ barrier insulating film 14 and a second interlayer insulating film 15, and the $Ta_2O_5$ barrier insulating film 14 and the second interlayer insulating film 15 on the TaSiN barrier metal layer 13 are opened to form an Al plate line 16.

Furthermore, the entirety is covered with a third interlayer insulating film 17. Then, a contact hole is formed on the source region 3 in the third interlayer insulating film 17, where an Al bit line 18 for implementing contact with the source region 3 is formed.

In this arrangement, the TaSiN barrier metal layer 13 has electrical conductivity and hydrogen-gas blocking property, and has an amorphous structure stable in high temperature region. Accordingly, hydrogen gas generated during the later formation of the second interlayer insulating film 15 is blocked from invading to the oxide ferroelectric thin film 11 side. Thus, the interface reduction and characteristic deterioration of the oxide ferroelectric thin film 11 due to the hydrogen gas is prevented. Further, the need of opening the upper electrode takeout hole is eliminated by the property of electrical conductivity, and a good contact with the later-formed Al plate line 16 can be implemented while the oxide ferroelectric thin film 11 is protected.

The ferroelectric memory device having the above constitution is formed by the following procedure.

Figure 2A:
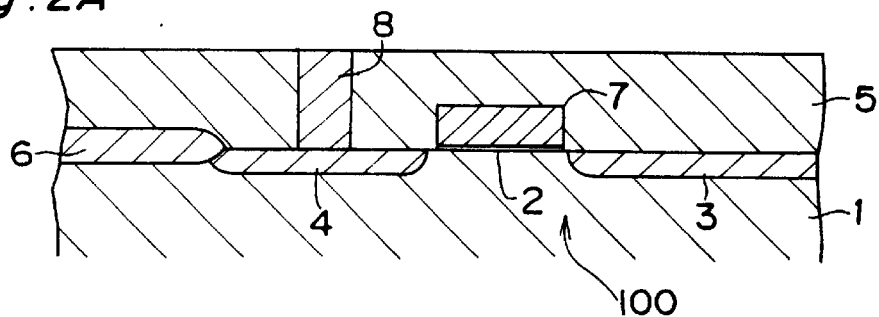
FIGS. 2A, 2B, 2C and 2D are views showing the formation procedure of the ferroelectric memory device shown in FIG. 1.

First, as shown in FIG. 2A, device isolation oxide film 6 for isolating devices from one another is formed on the first conductive type silicon substrate 1. After that, by a common MOSFET (MOS Field-Effect Transistor) formation process, a MOSFET 100 comprising the gate oxide film 2, the source region 3, the drain region 4 and the polysilicon word line 7 is formed. Then, after the MOSFET 100 is covered with the first interlayer insulating film 5 comprising BPSG, a contact hole is bored in only a part where the capacitor part 200 contacts the drain region 4, by using photolithography process and dry etching process, and impurity-diffused polysilicon is buried therein to form the contact plug 8. Then, surfaces of the first interlayer insulating film 5 and the contact plug 8 are smoothed by CMP (Chemical Mechanical Polishing) process.

Figure 2B:
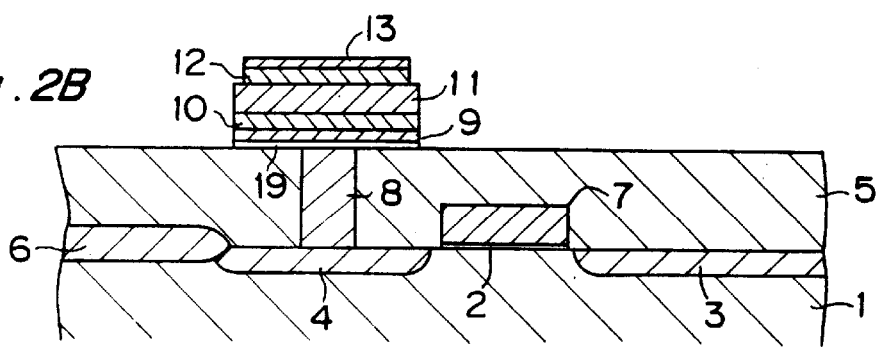

Next, as shown in FIG. 2B, the Ti layer 19 with film thickness 3000 Å and the TiN barrier metal layer 9 with film thickness 2000 Å are deposited in succession by sputtering, and subsequently, Pt thin film is deposited at a film thickness of 1000 Å by sputtering, by which a Pt lower electrode 10 is formed. Then, on this Pt lower electrode 10, $SrBi_2Ta_2O_9$ thin film (hereinafter, abbreviated as SBT thin film) is deposited at a film thickness of 2000 Å as the oxide ferroelectric thin film 11. In addition, the formation of the SBT thin film 11 is achieved through a process of spin coating a precursor solution which has been prepared with a slightly Bi-excess ratio of Sr:Bi:Ta=1:2.2:2, divisionally in three times, drying and then firing the product. After that, Pt film is deposited at a film thickness of 1000 Å by sputtering to form the Pt upper electrode 12, and further thereon, the TaSiN barrier metal layer 13 is deposited at a film thickness of 1000 Å. It is noted that the Ti layer 19 is a layer for reduction of contact resistance with the contact plug 8 and for improvement in the adhesion with the Pt lower electrode 10.

Reactive sputtering process is used for the deposition of the TaSiN barrier metal layer 13. This reactive sputtering is implemented with an RF (Radio Frequency) sputtering instrument using a mixed gas of Ar and $N_2$. This RF sputtering instrument is targeted for Ta and Si, and is enabled to change the Ta/Si/N composition ratio by changing the supply power to each target and the $N_2$ gas flow-rate ratio. In this embodiment, the supply power to the Ta target was set to 300 W, while the supply power to the Si target was set to 400 W, and the $N_2$ gas flow-rate ratio in the mixed gas was 10% and the film-deposition pressure was 4.0 mTorr. Then, it was confirmed that the composition of the TaSiN thin film deposited under these conditions was $Ta_{0.80}Si_{0.20}N_{0.59}$, by measurement using RBS (Rutherford Backscattering Spectrometry).

After that, the Pt upper electrode 12 and the TaSiN barrier metal layer 13 are processed into a size of 1.7 μm square by using photolithography and dry etching processes, and then firing for crystallization of the SBT thin film (oxide ferroelectric thin film) 11 is done. Further, the SBT thin film 11, the Pt lower electrode 10, the TiN barrier metal layer 9 and the Ti layer 19 are processed into a size of 2.0 μm square by using photolithography and dry etching processes, thus forming the layers into such a configuration as shown in FIG. 2B. In addition, an ECR (Electron Cyclotron Resonance) etcher is used for the dry etching.

The TaSiN barrier metal layer 13 never crystallizes during the firing for the crystallization of the SBT thin film 11, but maintains the amorphous structure stable in high temperature region. Accordingly, it never occurs that grain boundaries make paths to cause insufficient blocking of hydrogen gas, which would occur when the crystallization is involved. This was confirmed by the fact that when only the TaSiN thin film was deposited, the result of X-ray diffraction measurement on a sample fired under the same conditions was non-crystallinity.

Figure 2C:
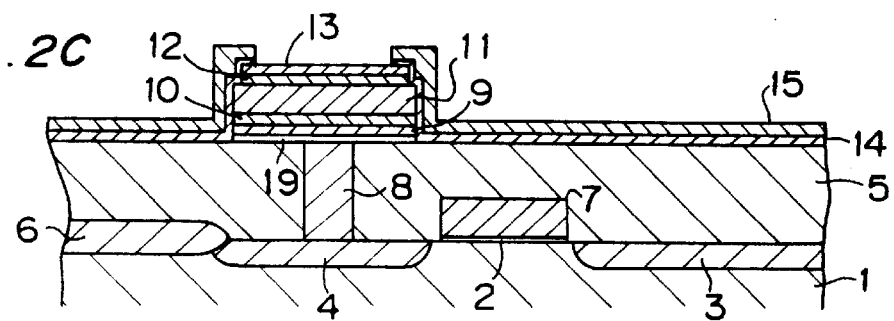

Next, as shown in FIG. 2C, the $Ta_2O_5$ barrier insulating film 14 with film thickness 300 Å was deposited by sputtering, and subsequently an ozone TEOS (tetraethoxysilane; $Si(OC_2H_5)_4$) film with film thickness 2000 Å is formed by CVD (Chemical Vapor Deposition) to form the second interlayer insulating film 15. After that, in an area on the SBT thin film 11 in the $Ta_2O_5$ barrier insulating film 14 and the second interlayer insulating film 15, a 1.2 μm square contact hole is formed by photolithography and dry etching processes.

In this process, as described above, hydrogen gas is generated as a reactive byproduct during the formation of the second interlayer insulating (ozone TEOS) film 15. However, in this embodiment, since the TaSiN barrier metal layer 13 having hydrogen-gas blocking property and having an amorphous structure stable in high temperature region is formed on the Pt upper electrode 12, the invasion of this hydrogen gas to the oxide ferroelectric thin film 11 side is blocked securely.

Figure 2D:
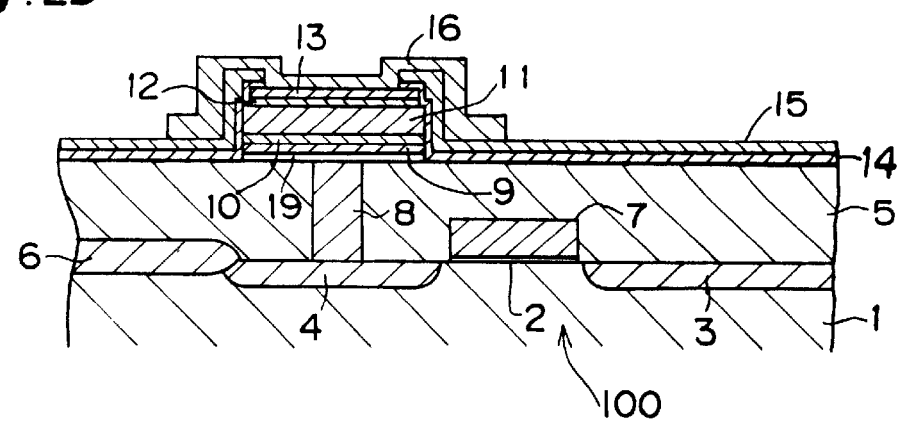

Next, as shown in FIG. 2D, the Al electrode is formed at a film thickness of 4000 Å and processed by photolithography and dry etching processes so as to be formed into the Al plate line 16. After that, the Al plate line 16 is heat treated at 400° C. for 30 min. in a normal-pressure nitrogen atmosphere, so that the electrode interface is stabilized.

Next, a plasma TEOS film is formed at a film thickness of 5000 Å by plasma CVD process, to form the third interlayer insulating film 17 of FIG. 1. Then, a contact hole to the source region 3 is formed by photolithography and dry etching processes, and the Al bit line 18 for enabling contact with the source region 3 is formed by using a known Al wiring technique. Thus, the ferroelectric memory device shown in FIG. 1 is formed.

After this on, although not described in detail, heat treatment is carried out in a hydrogen-mixed nitrogen gas (forming gas) for the restoration of characteristic deteriorations of the MOS transistors 100 due to lattice defects that occur within the silicon single crystal substrate during the fabrication of the ferroelectric memory device. Although the hydrogen concentration of the forming gas used in this case is higher than that of hydrogen generated during the formation of the second interlayer insulating film 15, the invasion of the hydrogen gas in the forming gas to the oxide ferroelectric thin film 11 side is blocked by the TaSiN barrier metal layer 13 formed on the Pt upper electrode 12.

Figure 3:
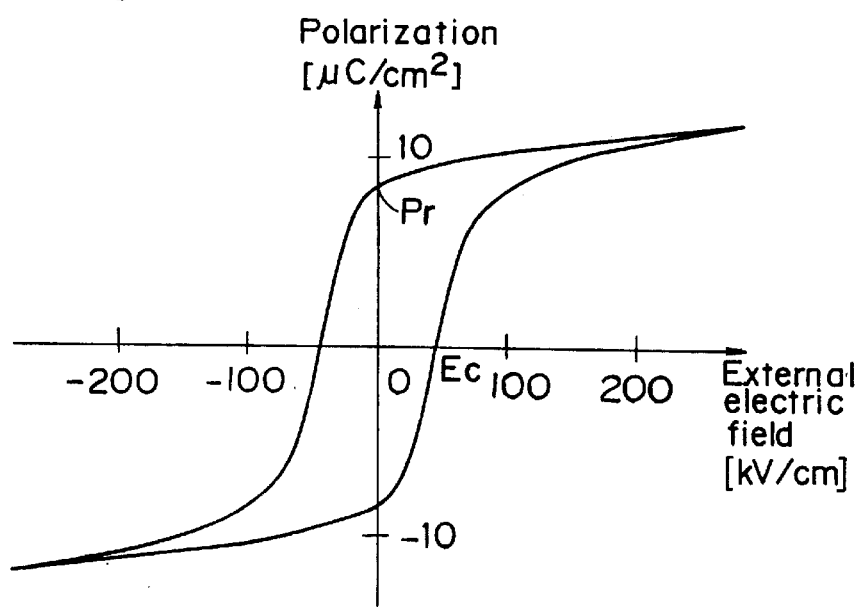
FIG. 3 is a view showing an external electric field—polarization hysteresis loop in the ferroelectric memory device shown in FIG. 1.

Ferroelectric characteristics of the ferroelectric memory device formed in this way were measured with the Soya tower bridge circuit. FIG. 3 shows an external electric field—polarization hysteresis loop with an application voltage of 3 V. From FIG. 3, it was confirmed that the residual dielectric polarization Pr was 8.5 μC/cm² and the coercive electric field Ec was 40 kV/cm, hence enough ferroelectric characteristics as a ferroelectric capacitor. Also, the leakage current density of the ferroelectric memory device was measured by current-voltage measurement process. As a result, from the fact that the leakage current at an application voltage of 3 V was 5×10$^{-8}$ A/cm² and that dielectric breakdown did not occur even at the application voltage of 10 V, it was confirmed that the ferroelectric memory device has enough leakage current characteristic as a ferroelectric capacitor.

Figure 4:
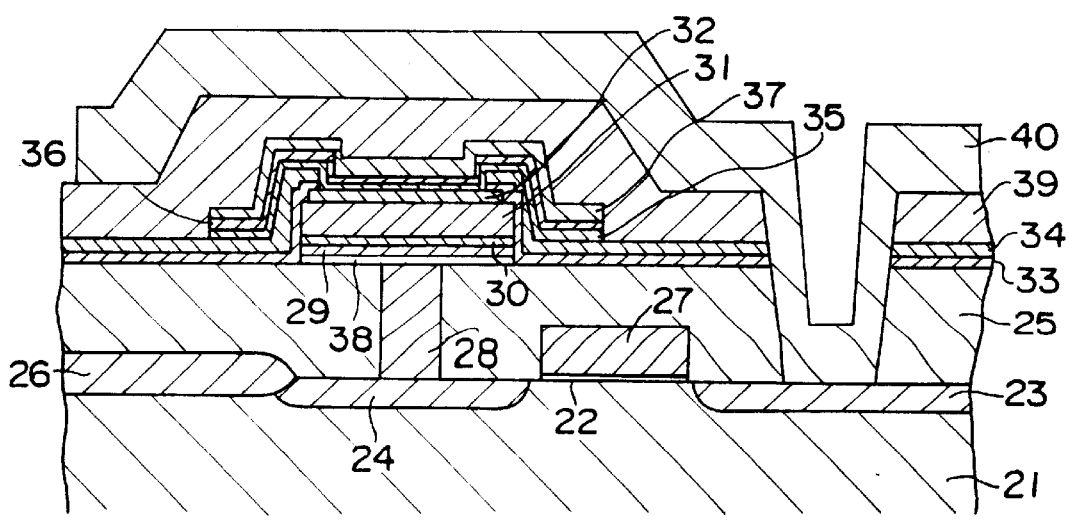
FIG. 4 is a sectional view of a ferroelectric memory device according to the prior art.

Next, results of a comparison between the ferroelectric memory device of this embodiment and a ferroelectric memory device of the prior art (hereinafter, referred to as a comparative sample) are described. FIG. 4 is a sectional view of the comparative sample.

A first conductive type silicon substrate 21, a gate oxide film 22, a source region (second conductive type impurity diffusion region) 23, a drain region (second conductive type impurity diffusion region) 24, a first interlayer insulating film 25, a device isolation oxide film 26, a polysilicon word line 27, a contact plug 28, a Ti layer 38, a TiN barrier metal layer 29, a Pt lower electrode 30, an oxide ferroelectric thin film 31, a Pt upper electrode 32, a $Ta_2O_5$ barrier insulating film 33, a second interlayer insulating film 34, a third interlayer insulating film 39 and an Al bit line 40 have the same constitutions as the first conductive type silicon substrate 1, the gate oxide film 2, the source region (second conductive type impurity diffusion region) 3, the drain region (second conductive type impurity diffusion region) 4, the first interlayer insulating film 5, the device isolation oxide film 6, the polysilicon word line 7, the contact plug 8, the Ti layer 19, the TiN barrier metal layer 9, the Pt lower electrode 10, the oxide ferroelectric thin film 11, the Pt upper electrode 12, the $Ta_2O_5$ barrier insulating film 14, the second interlayer insulating film 15, the third interlayer insulating film 17 and the Al bit line 18 in the ferroelectric memory device shown in FIG. 1, respectively.

Furthermore, in this comparative sample, the $Ta_2O_5$ barrier insulating film 33 and the second interlayer insulating film 34 formed on the Pt upper electrode 32 are opened, where a Ti contact layer 35, a TiN barrier metal layer 36 and an Al plate line 37 are formed. It is noted that the TiN barrier metal layer 36 is a hydrogen gas blocking layer. Also, the Ti contact layer 35 is a contact layer for contact between the second interlayer insulating film 34 and the TiN barrier metal layer 36.

The above comparative sample is formed by the following procedure.

Figure 5A:
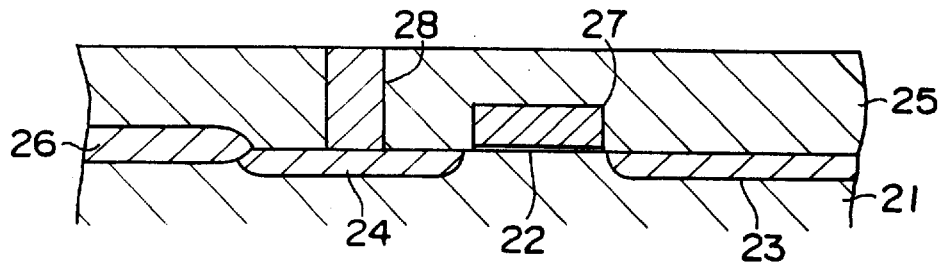
FIGS. 5A, 5B, 5C and 5D are views showing the formation procedure of the prior art ferroelectric memory device shown in FIG. 4.
Figure 5B:
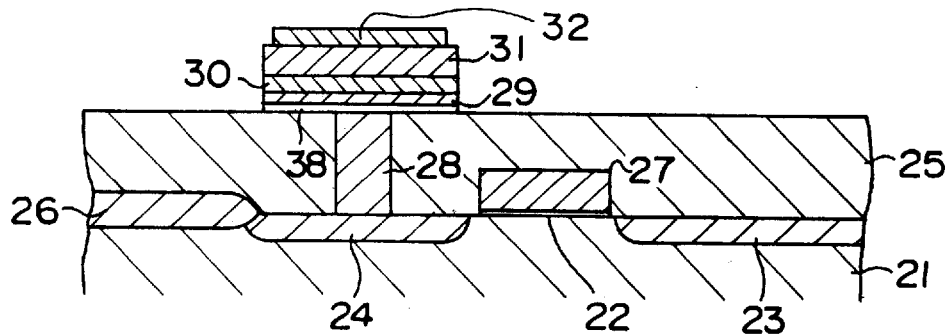

By the same procedure as that for the ferroelectric memory device of this embodiment, as shown in FIGS. 5A and 5B, on a first conductive type silicon substrate 21, are formed a gate oxide film 22, a source region 23, a drain region 24, a first interlayer insulating film 25, a device isolation oxide film 26, a polysilicon word line 27, a contact plug 28, a TiN barrier metal layer 29, a Pt lower electrode 30, an oxide ferroelectric thin film (SBT thin film) 31 and a Pt upper electrode 32. Then, the Pt upper electrode 32 is processed into a size of 1.7 μm square, the SBT thin film 31 is fired, and the SBT thin film 31, the Pt lower electrode 30, the TiN barrier metal layer 29 and a Ti layer 38 are processed into a size of 2.0 μm square.

Figure 5C:
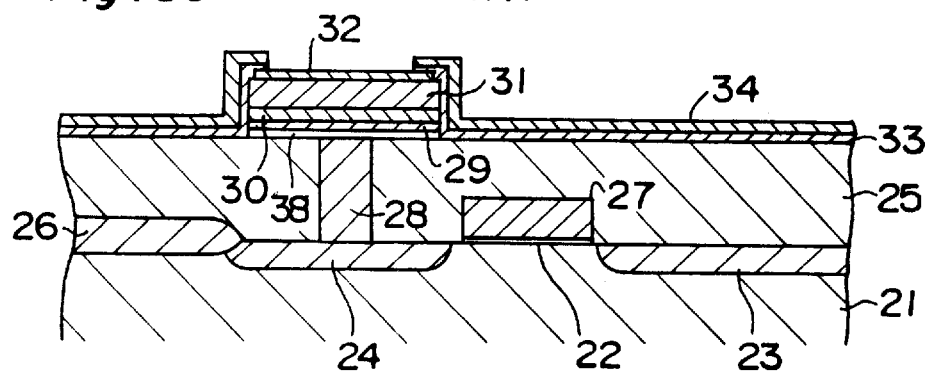

Next, further on these, by the same formation procedure as with the ferroelectric memory device of this embodiment, as shown in FIG. 5C, the $Ta_2O_5$ barrier insulating film 33 and the second interlayer insulating film 34 are formed, and a 1.2 μm square contact hole is formed in the region on the SBT thin film 31.

Figure 5D:
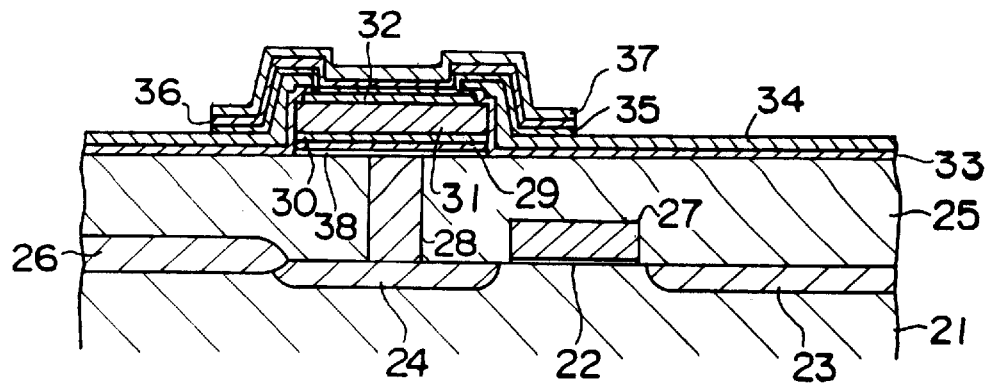

Next, as shown in FIG. 5D, Ti is deposited at a film thickness of 100 Å, forming a Ti contact layer 35. Further, TiN is deposited at a film thickness of 500 Å, forming a TiN barrier metal layer 36. After that, an Al electrode is formed at a film thickness of 4000 Å, and these are processed by using the photolithography and dry etching processes so as to be formed into an Al plate line 37. Over these processes, heat treatment is carried out at 400° C. for 30 min. in a normal-pressure nitrogen atmosphere, so that the electrode interface is stabilized.

Next, subsequently thereon, by the same formation procedure as with the ferroelectric memory device in this embodiment, a third interlayer insulating film 39 and an Al bit line 40 are formed, by which a comparative sample as shown in FIG. 4 is formed.

Ferroelectric characteristics of the comparative sample formed in this way were measured with the Soya tower bridge circuit. FIG. 6 shows an external electric field—polarization hysteresis loop with an application voltage of 3 V. From the figure, it can be understood that the residual dielectric polarization Pr was 5.0 $\mu C/cm^2$ and the coercive electric field Ec was 60 kV/cm, where the residual dielectric polarization Pr decreased while the coercive electric field Ec increased, resulting in a smoother hysteresis loop, as compared with the hysteresis loop of the ferroelectric memory device of the embodiment shown in FIG. 3.

The fact that the external electric field—polarization hysteresis loop is smoother means that it cannot be decided easily nor correctly in some cases whether the retained information is "0" or "1". The reason of this is that because the hydrogen-gas blocking layer of the comparative sample is implemented by the TiN barrier metal layer 36 of columnar crystal, grain boundaries or the like make paths so that enough hydrogen-gas blocking effect cannot be obtained, causing deterioration of the partial pressure characteristic of the SBT thin film (oxide ferroelectric thin film) 11.

Also, the leakage current density of the comparative sample was measured by current-voltage measurement process. As a result, it was confirmed that the leakage current at the applied voltage of 3 V was $3 \times 10^{-5}$ $A/cm^2$, where dielectric breakdown occurred at around the applied voltage 3 V, hence characteristics necessary for the application to the capacitor having been impaired. This means that enough hydrogen-gas blocking effect was not obtained by the TiN barrier metal layer 36 while the leakage current characteristic of the ferroelectric capacitor also deteriorated.

In contrast to this, in the ferroelectric memory device of this embodiment, the hydrogen-gas blocking layer is implemented by the TaSiN barrier metal layer 13 having electrical conductivity and hydrogen-gas blocking property. Then, this TaSiN barrier metal layer 13 maintains the amorphous structure stable in high temperature region without crystallizing even during the firing for the crystallization of the SBT thin film 11. Therefore, hydrogen gas generated during the later formation of the second interlayer insulating film 15 can be blocked reliably. Besides, because the TaSiN barrier metal layer 13 has electrical conductivity, the need of opening an electrode takeout hole is eliminated, thus making it possible to obtain good contact with the Al plate line 16 while the SBT thin film 11 is sufficiently protected.

That is, according to this embodiment, deterioration of characteristics of the STB thin film 11 due to hydrogen gas generated during the formation of the second interlayer insulating film 15 can be prevented. As a result, an abrupt external electric field—polarization hysteresis loop can be maintained, so that a successful memory device is obtained which can discriminate whether the retained information is "0" or "1", easily and correctly.

In addition, although sputtering is used in this embodiment for the formation of the TaSiN barrier metal layer 13, other processes such as CVD process may also be used without any constraints.

Also, in this embodiment, the TaSiN barrier metal layer 13 is used as the hydrogen gas barrier metal layer, but this invention is not limited to this. For example, even nitrides in combination of Si and any one of Zr, Nb, Mo, Hf, Ta and W, or even nitrides in combination of Si and any combination among Zr, Nb, Mo, Hf, Ta and W can also prevent the diffusive permeation of hydrogen gas, and effects similar to those of TaSiN can be expected.

Also, this embodiment has been described on a case where the TaSiN barrier metal layer 13 has a composition of $Ta_{0.80}Si_{0.20}N_{0.59}$. However, as a result of experiments in which values of x, y were varied in an expression of the hydrogen gas barrier metal, $M_xSi_{1-x}N_y$, it was confirmed that only if $0.75 \leq x \leq 0.95$ and $0 < y \leq 1.3$, then the hydrogen gas blocking effect can be obtained, where M is any one of Zr, Nb, Mo, Hf, Ta and W.

Furthermore, in this embodiment, SBT thin film is used as a material for the oxide ferroelectric thin film. However, without being limited to this, the present invention is applicable to such materials as $PZT(Pb(Zr, Ti)O_3)$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $CaBi_2Ta_2O_9$, $BaBi_2Ta_2O_9$, $BaBi_2Nb_2O_9$, $PbBi_2Ta_2O_9$ and the like.

Also, although the above embodiment has been explained on an example of hydrogen-gas blocking effect for the oxide ferroelectric thin film, hydrogen-gas blocking effect can be obtained also for an oxide high-dielectric thin film, making it possible to prevent peelings between the upper electrode and the oxide high-dielectric thin film due to the invasion of hydrogen gas as well as characteristic deteriorations of the oxide high-dielectric capacitor.

(Second Embodiment)

In this embodiment, an upper electrode having electrical conductivity and oxygen-gas blocking property and moreover exhibiting an amorphous structure stable in high temperature region is formed on an oxide high-dielectric thin film.

FIG. 7 is a sectional view of a high dielectric memory device of this embodiment. This high dielectric memory device has the following constitution.

That is, a MOS transistor 101 having a gate oxide film 42, a second conductive type impurity diffusion region 43 as a source region, and a second conductive type impurity diffusion region 44 as a drain region is formed on a first conductive type silicon substrate 41 and covered with a first interlayer insulating film 45. Reference numeral 46 denotes device isolation oxide film and 47 denotes a polysilicon word line. Then, in the first interlayer insulating film 45, a contact plug 48 is formed for connecting the MOS transistor 101 and capacitor part 201 to each other.

At a position on the first interlayer insulating film 45 where the contact plug 48 is provided, a TiN barrier metal layer 49, a Pt lower electrode 50, an oxide high-dielectric thin film 51 and a TaSiN upper electrode 52 are formed in succession, forming the capacitor part 201. The capacitor part 201 is further covered with a second interlayer insulating film 53, and the second interlayer insulating film 53 on the TaSiN upper electrode 52 is opened, where an Al plate line 54 is formed.

Furthermore, the entirety is covered with a third interlayer insulating film 55. Then, a contact hole is formed on the source region 43 in the third interlayer insulating film 55, where an Al bit line 56 for implementing contact with the source region 43 is formed.

In this arrangement, the TaSiN upper electrode 52 has electrical conductivity and oxygen-gas blocking property, and has an amorphous structure stable in high temperature region. Accordingly, oxygen gas that would attempt to escape from the oxide high-dielectric thin film 51 to the upper electrode side during the firing of the oxide high-dielectric thin film 51 is blocked. Thus, a high dielectric memory device having successful leakage current characteristic can be obtained. In addition, oxide ferroelectric thin film may also be used in place of the oxide high-dielectric thin film 51.

Hereinbelow, the effect of the TaSiN upper electrode 52 for preventing deterioration of leakage current characteristic of the oxide high-dielectric thin film 51 is explained more concretely on an example of a simpler model device (hereinafter, referred to as a leakage current characteristic evaluation device).

Figure 8A:
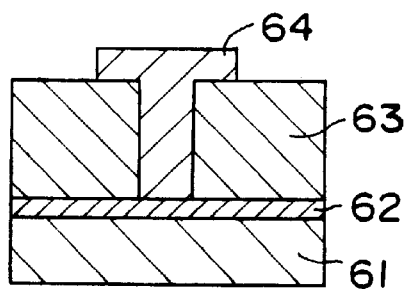
FIGS. 8A, 8B, 8C and 8D are views showing the formation procedure of a leakage current characteristic evaluation device which is a model of the high dielectric memory device shown in FIG. 7.
Figure 8B:
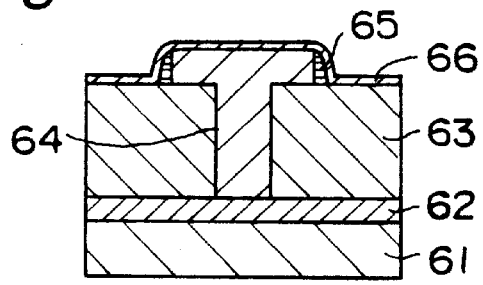
Figure 8C:
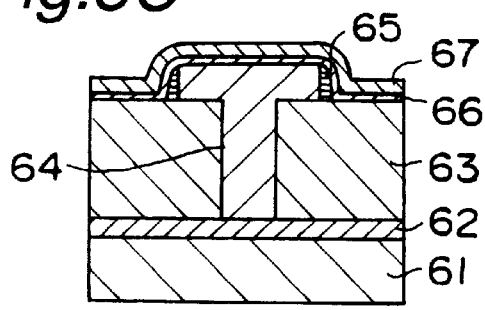
Figure 8D:
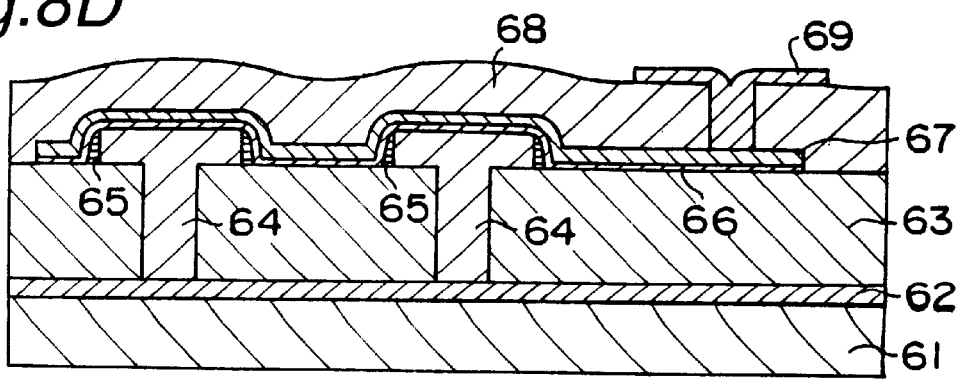

FIG. 8D is a sectional view of the leakage current characteristic evaluation device. This leakage current characteristic evaluation device has $4 \times 10^7$ arrays, allowing a multiplicity of evaluation results to be obtained at a time and having the following constitution.

That is, an N$^+$ type impurity diffusion layer 62 (where the MOS in FIG. 7 is assumed) and a first interlayer insulating film 63 are formed on an N type silicon substrate 61. Then, in the first interlayer insulating film 63, a polysilicon plug 64 for connecting the N$^+$ type impurity diffusion layer 62 and the capacitor part to each other is formed, and a side wall 65 is formed at a site where this polysilicon plug 64 is protruded from the first interlayer insulating film 63.

In a specified area including the polysilicon plug 64 and the side wall 65, a capacitor insulating film 66 as the oxide high-dielectric thin film and a TaSiN upper electrode 67 are formed, constituting the capacitor part. Further, the entirety is covered with a second interlayer insulating film 68. Then, a contact hole is formed on the TaSiN upper electrode 67 in the second interlayer insulating film 68, where an Al pull-up electrode 69 for implementing contact with the TaSiN upper electrode 67 is formed.

The leakage current characteristic evaluation device having the above constitution is formed by the following procedure.

First, as shown in FIG. 8A, the N$^+$ type impurity diffusion layer 62 is formed over the entire surface of the N type silicon substrate 61, and then covered with the first interlayer insulating film 63 comprising BPSG. After that, at a specified position on the first interlayer insulating film 63, a contact hole having a 0.18 $\mu$m diameter is bored by using photolithography process and dry etching process, and impurity-diffused polysilicon is buried therein to form the polysilicon plug 64. Then, a 0.55 $\mu$m$\times$0.3 $\mu$m rectangular area is formed in upper part of the polysilicon plug 64 so as to protrude on the first interlayer insulating film 63.

Next, as shown in FIG. 8B, NSG (Non-doped Silicate Glass) with film thickness 1000 Å is deposited by CVD process, and the side wall 65 is formed by etchback. After that, surface nitriding process is carried out in ammonia by RTA (Rapid Thermal Annealing), and a Ta$_2$O$_2$ thin film with film thickness 120 Å is deposited by CVD process to provide the capacitor insulating film 66. Then, firing process at 500° C.–700° C. for 30 min. is carried out in an oxygen atmosphere in order to stabilize the Ta$_2$O$_2$ thin film (capacitor insulating film) 66. Over these steps, as shown in FIG. 8C, a TaSiN thin film is formed at a film thickness of 1000 Å, by which the TaSiN upper electrode 67 is provided.

In addition, during the firing for the stabilization of the capacitor insulating film 66, the TaSiN upper electrode 67 does not crystallize but maintains an amorphous structure stable in high temperature region. As a result, by the firing process, oxygen that would attempt to escape from the capacitor insulating film 66, which is an oxide high dielectric, to the TaSiN upper electrode 67 side is blocked reliably.

Reactive sputtering process is used for the deposition of the TaSiN upper electrode 67. This reactive sputtering is implemented with an RF sputtering instrument using a mixed gas of Ar and N$_2$. In this embodiment, the supply power to the Ta target was set to 300 W, while the supply power to the Si target was set to 400 W, and the N$_2$ gas flow-rate ratio in the mixed gas was 10% and the film-deposition pressure was 4.0 mTorr. Then, it was confirmed that the composition of the TaSiN thin film deposited under these conditions was Ta$_{0.80}$Si$_{0.20}$N$_{0.59}$, by measurement using RBS.

After that, as shown in FIG. 8D, the capacitor insulating film 66 and the TaSiN upper electrode 67 are patterned by using photolithography and dry etching processes, and a 2000 Å thick ozone TEOS film is formed by using CVD process, by which the second interlayer insulating film 68 is provided. After that, on the assumption of conditions for actual DRAM fabrication process, firing process at 500° C.–600° C. for 30 min. is carried out in a nitrogen atmosphere.

Next, a contact hole is formed at a specified position on the TaSiN upper electrode 67 in the second interlayer insulating film 68 by using photolithography and dry etching processes, where the Al pull-up electrode 69 for implementing contact with the TaSiN upper electrode 67 is formed at a film thickness of 4000 Å. Then, the Al pull-up electrode 69 is formed by using photolithography and dry etching processes, by which a leakage current characteristic evaluation device which is a model of the high dielectric memory device shown in FIG. 7 is formed.

In the leakage current characteristic evaluation device formed in this way, leakage current of the capacitor insulating film 66 after the firing process was measured by current-voltage measuring process. The measurement in this case was carried out by applying a voltage between the Al pull-up electrode 69 and the N$^+$ type impurity diffusion layer 62. As a result, it was confirmed that the leakage current at an applied voltage of 1.0 V was $1.2 \times 10^{-8}$ A/cm$^2$, hence enough leakage current characteristic as a high dielectric capacitor.

Next, results of a comparison between the leakage current characteristic evaluation device which is a model of the high dielectric memory device of this embodiment and a leakage current characteristic evaluation device which is a model of the prior art high dielectric memory device (hereinafter, referred to as a comparative sample) are described. FIG. 9D is a sectional view of the comparative sample.

An N type silicon substrate 71, an N$^+$ type impurity diffusion layer 72, a first interlayer insulating film 73, a polysilicon plug 74, a side wall 75, a capacitor insulating film 76, a second interlayer insulating film 78 and an Al pull-up electrode 79 have the same constitutions as the N type silicon substrate 61, the N$^+$ type impurity diffusion layer 62, the first interlayer insulating film 63, the polysilicon plug 64, the side wall 65, the capacitor insulating film 66, the second interlayer insulating film 68 and the Al pull-up electrode 69 shown in FIG. 8D, respectively.

Furthermore, in the comparative sample, a TiN upper electrode 77 is formed on the capacitor insulating film 76, and put into contact with the Al pull-up electrode 79.

The above comparative sample is formed by the following procedure.

Figure 9A:
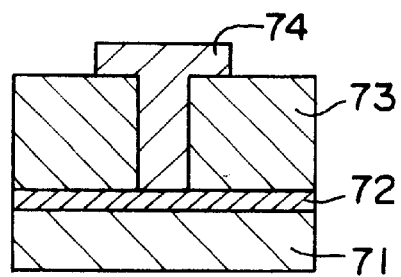
FIGS. 9A, 9B, 9C and 9D are views showing the formation procedure of a leakage current characteristic evaluation device which is a model of the prior art high dielectric memory device.
Figure 9B:
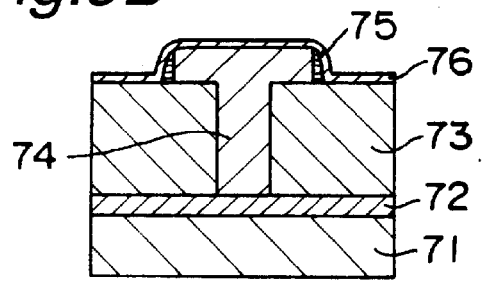

By the same formation procedure as that for the leakage current characteristic evaluation device in this embodiment, as shown in FIGS. 9A and 9B, on the N type silicon substrate 71, are formed an N$^+$ type impurity diffusion layer 72, a first interlayer insulating film 73, a polysilicon plug 74, a side wall 75 and a capacitor insulating film 76. Then, firing process is carried out to stabilize the capacitor insulating film 76.

Figure 9C:
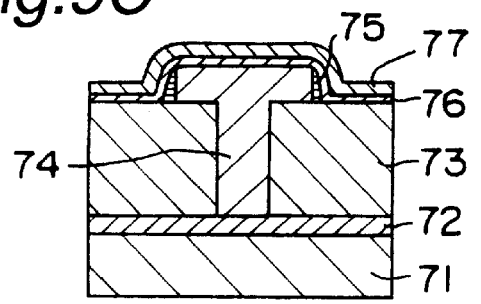
Figure 9D:
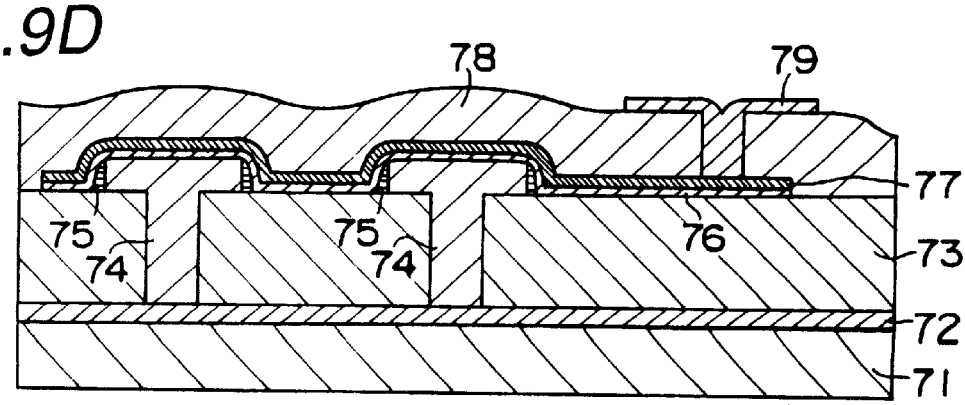

Next, as shown in FIG. 9C, a TiN thin film is formed at a film thickness of 1000 Å by CVD process, by which a TiN upper electrode 77 is provided.

Subsequently, by the same procedure as the formation procedure of the leakage current characteristic evaluation device in this embodiment, as shown in FIG. 9D, the capacitor insulating film 76 and the TiN upper electrode 77 are patterned and, after that, the second interlayer insulating film 78 and the Al pull-up electrode 79 are formed. In this way, a comparative example which is a model of the prior art high dielectric memory device having a TiN upper electrode is formed.

Leakage current of the fired capacitor insulating film 76 in the comparative sample formed in this way was measured by current-voltage measurement process. As a result, the leakage current at the applied voltage of 1.0 V was $4.13 \times 10^{-6}$ A/cm$^2$, showing an increase in leakage current of about two orders as compared with that of a current-voltage measurement dedicated device using the high dielectric capacitor of this embodiment. This value is an insufficient value for use as a high dielectric capacitor. In addition, the increase in leakage current is due to the fact that enough oxygen-gas blocking effect is not obtained because the upper electrode of the comparative example is made of TiN.

In contrast to this, in the leakage current characteristic evaluation device which is a model of the ferroelectric memory device of this embodiment, the upper electrode is formed of TaSiN having electrical conductivity and oxygen-gas blocking property. Therefore, this TaSiN upper electrode 67 maintains the amorphous structure stable in high temperature region without crystallizing even during the firing of the capacitor insulating film 66, which is an oxide high-dielectric thin film. Thus, oxygen gas that would escape toward the TaSiN upper electrode 67 side can be blocked reliably.

Further, such an oxygen-gas blocking function of the leakage current characteristic evaluation device in this embodiment can be exerted likewise also in the case of the high dielectric memory device having the capacitor part comprising the Pt lower electrode 50, the oxide high-dielectric thin film 51 and the TaSiN upper electrode 52 as shown in FIG. 7. Therefore, according to this embodiment, a high dielectric memory device having good leakage current characteristics can be obtained.

In addition, although sputtering is used in this embodiment for the formation of the TaSiN upper electrode 67, other processes such as CVD process may also be used without any constraints.

Also, in this embodiment, TaSiN is used as the barrier metal for oxygen gas, but this invention is not limited to this. For example, even nitrides in combination of Si and any one of Zr, Nb, Mo, Hf, Ta and W, or even nitrides in combination of Si and any combination among Zr, Nb, Mo, Hf, Ta and W can also prevent the escape of oxygen gas from the oxide high dielectric, where nearly the same effects as with TaSiN can be expected.

Also, this embodiment has been described on a case where the TaSiN upper electrode 67 as an oxygen-gas barrier layer has a composition of $Ta_{0.80}Si_{0.20}N_{0.59}$. However, as a result of performing tests in which values of x, y were varied in an expression of the oxygen gas barrier metal, $M_xSi_{1-x}N_y$, it was confirmed that only if $0.75 \leq \leq 0.95$ and $0 < y \leq 1.3$, then the hydrogen gas blocking effect can be obtained, where M is any one of Zr, Nb, Mo, Hf, Ta and W.

As apparent from the above description, according to the semiconductor memory device of the present invention, since a barrier layer having electrical conductivity and hydrogen-gas blocking property is provided on a capacitor comprising a lower electrode, an oxide high-dielectric thin film or oxide ferroelectric thin film and an upper electrode, hydrogen gas generated during the formation of the interlayer insulating film or hydrogen gas used during the restoration of the MOS characteristics can be blocked by the barrier layer from invading to the oxide high-dielectric thin film or oxide ferroelectric thin film side.

Therefore, the reduction effect of the hydrogen gas on the oxide dielectric thin-film interface can be prevented, and the peeling between the upper electrode and the oxide dielectric thin film as well as the characteristic deterioration of the capacitor including the oxide dielectric thin film can be avoided.

Further, because the barrier layer has electrical conductivity, there is no need of providing an opening as an electrode takeout hole. Accordingly, the barrier layer can be brought into good contact with the lead-out wiring while sufficiently protecting the oxide dielectric thin film.

Furthermore, when the barrier layer never crystallizes but keeps amorphous at the firing temperatures for crystallizing the oxide dielectric thin film, paths of grain boundaries are not formed so that the hydrogen-gas blocking effect can be fulfilled effectively.

Also, in the semiconductor memory device of the present invention, since an upper electrode having electrical conductivity and oxygen-gas blocking property is provided on an oxide high-dielectric thin film, oxygen gas can be prevented by the oxygen-gas blocking effect of the upper electrode from escaping from the oxide high-dielectric thin film during the firing of the oxide high-dielectric thin film. Therefore, deterioration of the leakage current characteristic of the oxide high-dielectric thin film due to the escape of the oxygen gas can be avoided.

Furthermore, when the upper electrode never crystallizes but keeps amorphous at the firing temperatures for the oxide high-dielectric thin film, paths of grain boundaries are not formed so that the prevention of escape of the oxygen gas from the oxide high-dielectric thin film can be fulfilled effectively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
   a capacitor including a lower electrode, an oxide high-dielectric thin film or oxide ferroelectric thin film, and an upper electrode; and
   a barrier layer which covers the upper electrode of the capacitor and which has electrical conductivity and hydrogen-gas blocking property,
   the barrier layer has such an amorphous structure that the barrier layer is not crystallized at firing temperatures for crystallizing the oxide high-dielectric thin film or oxide ferroelectric thin film.

2. The semiconductor memory device according to claim 1, further comprising
   a MOS transistor connected to the capacitor.

3. The semiconductor memory device according to claim 1, wherein
   the barrier layer is a nitride thin film in a combination of silicon and any combination among zirconium, niobium, molybdenum, hafnium, tantalum and tungsten.

4. The semiconductor memory device according to claim 3, wherein
   the barrier layer is formed of a material which is expressed as $M_xSi_{1-x}N_y$ where M represents the zirconium, niobium, molybdenum, hafnium, tantalum or tungsten, Si represents the silicon and N represents nitrogen, and which satisfies that $0.75 \leqq \leqq 0.95$ and $0 < y \leqq 1.3$.

5. A semiconductor memory device which comprises a capacitor including a lower electrode, an oxide high-dielectric thin film or oxide ferroelectric thin film stacked on the lower electrode, and an upper electrode which is stacked on the oxide high-dielectric thin film or oxide ferroelectric thin film and which has electrical conductivity and oxygen-gas blocking effect, the upper electrode has such an amorphous structure that the upper electrode is not crystallized at firing temperatures for crystallizing the oxide high-dielectric thin film or oxide ferroelectric thin film.

6. The semiconductor memory device according to claim 5, further comprising a MOS transistor connected to the capacitor.

7. The semiconductor memory device according to claim 5, wherein the upper electrode is a nitride thin film in a combination of silicon and any combination among zirconium, niobium, molybdenum, hafnium, tantalum and tungsten.

8. The semiconductor memory device according to claim 7, wherein the upper electrode is formed of a material which is expressed as $M_x Si_{1-x} N_y$ where M represents the zirconium, niobium, molybdenum, hafnium, tantalum or tungsten, Si represents the silicon and N represents nitrogen, and which satisfies that $0.75 \leqq \leqq 0.95$ and $0 < y \leqq 1.3$.

* * * * *

UNITED STATES PATENT AND TRADEMARK OFFICE
CERTIFICATE OF CORRECTION

PATENT NO.   : 6,246,082 B1                                             Page 1 of 1
DATED        : June 12, 2001
INVENTOR(S)  : Shun Mitarai *et al.*

It is certified that error appears in the above-identified patent and that said Letters Patent is hereby corrected as shown below:

<u>Title page,</u>
Item [73] Assignee,
       Add -- Hara, Tohru, Tokyo-to, Japan. --

Signed and Sealed this

Ninth Day of October, 2001

*Attest:*

*Attesting Officer*

NICHOLAS P. GODICI
*Acting Director of the United States Patent and Trademark Office*